(12) United States Patent
Knopik

(10) Patent No.: US 11,569,021 B2
(45) Date of Patent: Jan. 31, 2023

(54) POWER TRANSFORMER OF THE SYMMETRIC-ASYMMETRIC TYPE WITH A FULLY-BALANCED TOPOLOGY

(71) Applicant: STMicroelectronics SA, Montrouge (FR)

(72) Inventor: Vincent Knopik, Crets en Belledonne (FR)

(73) Assignee: STMicroelectronics SA, Montrouge (FR)

( * ) Notice: Subject to any disclaimer, the term of this patent is extended or adjusted under 35 U.S.C. 154(b) by 1024 days.

(21) Appl. No.: 16/275,091

(22) Filed: Feb. 13, 2019

(65) Prior Publication Data

US 2019/0180918 A1  Jun. 13, 2019

Related U.S. Application Data

(63) Continuation of application No. 15/223,148, filed on Jul. 29, 2016, now Pat. No. 10,249,427.

(30) Foreign Application Priority Data

Mar. 30, 2016  (FR) ..................................... 1652713

(51) Int. Cl.
```
H01Q 1/36      (2006.01)
H01F 27/28     (2006.01)
H01L 23/522    (2006.01)
H03H 7/42      (2006.01)
H01F 27/29     (2006.01)
H01F 38/14     (2006.01)
H01F 41/04     (2006.01)
```
(Continued)

(52) U.S. Cl.
CPC ......... *H01F 27/2804* (2013.01); *H01F 27/29* (2013.01); *H01F 38/14* (2013.01); *H01F 41/041* (2013.01); *H01F 41/10* (2013.01); *H01L 23/5227* (2013.01); *H01Q 1/243* (2013.01); *H01Q 1/36* (2013.01); *H01Q 1/48* (2013.01); *H01Q 1/50* (2013.01); *H01Q 7/00* (2013.01); *H03H 7/42* (2013.01); *H01F 2027/2809* (2013.01); *H01F 2027/2819* (2013.01)

(58) Field of Classification Search
None
See application file for complete search history.

(56) References Cited

U.S. PATENT DOCUMENTS

| | | | |
|---|---|---|---|
| 4,816,784 A | 3/1989 | Rabjohn | |
| 5,063,331 A | 11/1991 | Nostwick | |

(Continued)

FOREIGN PATENT DOCUMENTS

| | | | |
|---|---|---|---|
| CN | 101414508 A | 4/2009 | |
| CN | 101441934 A | 5/2009 | |

(Continued)

*Primary Examiner* — Graham P Smith
(74) *Attorney, Agent, or Firm* — Slater Matsil, LLP

(57) ABSTRACT

A transformer of the symmetric-asymmetric type includes comprising a primary inductive circuit and a secondary inductive circuit formed in a same plane by respective interleaved and stacked metal tracks. A first crossing region includes a pair of connection plates facing one another, with each connection plate having a rectangular shape that is wider than the metal tracks, and diagonally connected to tracks of the secondary inductive circuit.

23 Claims, 3 Drawing Sheets

(51) Int. Cl.
*H01F 41/10* (2006.01)
*H01Q 1/24* (2006.01)
*H01Q 1/48* (2006.01)
*H01Q 1/50* (2006.01)
*H01Q 7/00* (2006.01)

(56) References Cited

U.S. PATENT DOCUMENTS

| | | | |
|---|---|---|---|
| 6,608,364 B2 | 8/2003 | Carpentier | |
| 10,249,427 B2 * | 4/2019 | Knopik | H01Q 7/00 |
| 2012/0242406 A1 | 9/2012 | Ke | |
| 2015/0310980 A1 | 10/2015 | Yen et al. | |
| 2019/0180918 A1 * | 6/2019 | Knopik | H01F 41/10 |

FOREIGN PATENT DOCUMENTS

| | | |
|---|---|---|
| CN | 206040388 U | 3/2017 |
| EP | 0324240 A2 | 9/1988 |
| FR | 2819938 A1 | 7/2002 |

* cited by examiner

POWER TRANSFORMER OF THE SYMMETRIC-ASYMMETRIC TYPE WITH A FULLY-BALANCED TOPOLOGY

CROSS-REFERENCE TO RELATED APPLICATIONS

This application is a continuation application of U.S. patent application Ser. No. 15/223,148, filed Jul. 29, 2016, which is a translation of and claims the priority benefit of French patent application number 1652713 filed on Mar. 30, 2016, entitled "Balanced-To-Unbalanced Transformer For Power Application With Fully Balanced Topology" which are hereby incorporated by reference to the maximum extent allowable by law.

TECHNICAL FIELD

The disclosure relates to integrated transformers of the symmetric-asymmetric type, commonly denoted by the term BALUN (BALanced to UNbalanced). The disclosure is, for example, applicable in mobile telephony and motor vehicle radar systems.

BACKGROUND

The fabrication of integrated systems made of silicon, whether they are power or processing systems, is increasingly implemented using differential structures and variable reference impedances for analog parts. On the other hand, most everything else remains essentially a system of the asymmetric mode type with 50 Ohms reference impedances.

The link between a symmetric transmission line and an asymmetric transmission line cannot be implemented without a matched electrical circuit. This transition is provided by a transformer of the symmetric-asymmetric type called a balun.

A balun converts, for example, a signal of the asymmetric mode type (or single-ended according to terminology widely used by those skilled in the art) into a signal of the differential mode type, and vice-versa. The balun also ensures the transformation of impedances.

One of the main electrical characteristics of a balun is its insertion loss, which is advantageously as low as possible. Indeed, the insertion loss is the result in loss of the transformation applied. The loss may be due to an impedance mismatch, an imbalance in amplitude and/or phase between the two channels, a resistive loss, and/or all of these factors combined. This loss causes a reduction in the overall performance of the system employing this device.

Furthermore, the performance characteristics of a balun are mainly expressed in terms of amplitude and phase symmetries. There is a difference in amplitude and a phase shift between the input and output signals which are advantageously minimized.

Baluns may furthermore be used, for example, in receiver and transmission circuits of wireless communications systems. In particular, for the design of differential circuits such as amplifiers, mixers, oscillators and antenna systems.

In the transmission and receiver circuits of wireless communications systems, the impedance on the differential side may be low, typically on the order of 10 to 20 Ohms for a low-noise amplifier. The impedance on the single-ended side, in other words on the side of the antenna, as indicated above, is generally around 50 Ohms. This therefore means that a high transformation ratio is necessary, which can be particularly complicated to achieve.

Furthermore, notably in transmission, the power amplifier is to be supplied with a high current, on the order of a few hundred milliamps. Then, if it is desired to supply the power amplifier by means of the transformer (balun), this will have an impact on the performance of the balun.

For example, the high currents require a very wide metal track, which introduces an increase of the series resistance which is to the detriment of the insertion loss. Consequently, the design of baluns is usually limited to one turn per loop on the secondary circuit for high power circuits. This has the consequence that the coupling between the differential and single-ended channels is generally unequal and poorly distributed. This leads to poor performance characteristics, such as phase-shifts and amplitude mismatches.

SUMMARY

According to one embodiment, an integrated architecture is provided for a transformer of the symmetric-asymmetric type that is totally balanced, which allows signals to be obtained that are in phase and with corresponding amplitudes. This may notably be for power amplifier applications.

A transformer of the symmetric-asymmetric type may comprise an inductive primary circuit and an inductive secondary circuit formed in the same plane by respective interleaved and stacked metal tracks. The tracks may comprise at least a first crossing region in which two connection plates facing one another take the form of rectangular plates, wider than the metal tracks, and may each be diagonally connected to tracks of the secondary circuit.

The plane shapes facing one another of the crossing regions may offer a large crossing surface area. This may increase the coupling capacitance between all the turns of the transformer. Advantageously, notably in regards to noise signals, the widened portions may be the same size and may be are aligned along an axis perpendicular to the plane.

The connection plate passing over the other connection plate may comprise two wings each respectively situated on one end of two opposing sides of the rectangular plate. The ends may be diagonally opposite and the metal tracks of the secondary circuit may be connected onto the lower surface of the wings. Advantageously, the wings may each have a bevel at its connection with the rectangular plate. This configuration is notably advantageous in regards to current flow, such as in the case of a high intensity current flow.

The primary and secondary inductive circuits may each comprise a loop describing at least two turns and have an architecture that is symmetrical with respect to an axis of the plane. A geometrically symmetrical and balanced architecture with respect to coupling minimizes or reduces the phase and amplitude imbalances of the signals present on the primary and secondary circuits.

Generally speaking, one terminal of the primary circuit may be connected to a load and the other terminal to ground. Consequently, the coupling between the primary and secondary circuits does not take place in the same way between the tracks at positions close to the load terminal and at positions close to the ground terminal.

The primary and secondary inductive circuits may be configured such that, over all of the positions of the secondary circuit at which a coupling with the primary circuit may take place, the sum of the distances from one terminal of the primary circuit to the corresponding coupled positions of the primary circuit may be equal to the sum of the distances from the other terminal of the primary circuit to the same coupled positions.

In this configuration, the secondary circuit may be coupled with the primary circuit in equal proportions at positions of the primary circuit close to one terminal and at positions of the primary circuit close to the other terminal. In other words, the signal in the secondary circuit sees the ground terminal as much as the load terminal of the primary circuit.

Thus, during the flow of a signal over the secondary circuit, this signal may be coupled in a uniform manner with the whole of the primary circuit, offering good phase and amplitude symmetries. This allows excellent behaviors to be obtained with regard to the balance of phases and the balance of amplitudes. This is notably for power amplifier applications.

In one embodiment, the at least a first crossing region may comprises first metal tracks for connecting tracks of the primary circuit crossing each other under the connection plates.

According to one embodiment, the interleaved loops may comprise at least a second crossing region, in which second metal tracks for connecting the primary circuit cross each other on either side of a biasing terminal. One of the second connection tracks may pass above the biasing terminal and the other underneath.

Thus, the symmetry of the architecture and the balance of the couplings between the primary and secondary circuits may also be optimized at the crossing regions. Advantageously, the biasing terminal takes the form of a rectangular plate connected to a mid-point of the secondary circuit and situated in the neighborhood of the terminals of the secondary circuit. This allows decoupling capacitors to be connected between the biasing terminal and the ground of the differential circuit in an optimized manner with regard to space and performance.

According to one embodiment, metal tracks of the primary circuit may be narrower than the metal tracks of the secondary circuit, over at least a portion of the primary circuit. This may allow, aside from an advantageous reduction in the surface area occupied by the transformer, a stray capacitance existing between the primary circuit and ground of the substrate on which the transformer is fabricated to be limited.

According to one embodiment, the transformer may be fabricated in an integrated manner on top of a semiconductor substrate.

A circuit may also be provided that comprises an antenna, processing means or processor and a transformer previously described, connected between the antenna and the processing means. Furthermore, a telecommunications system may be provided, for example, of the cellular mobile telephone type, or tablet or equivalent, comprising such a circuit.

BRIEF DESCRIPTION OF THE DRAWINGS

Other advantages and features of the disclosure will become apparent from examining the detailed description of embodiments and their implementation, which are in no way limiting, and from the appended drawings in which.

DETAILED DESCRIPTION OF ILLUSTRATIVE EMBODIMENTS

Figure 1:
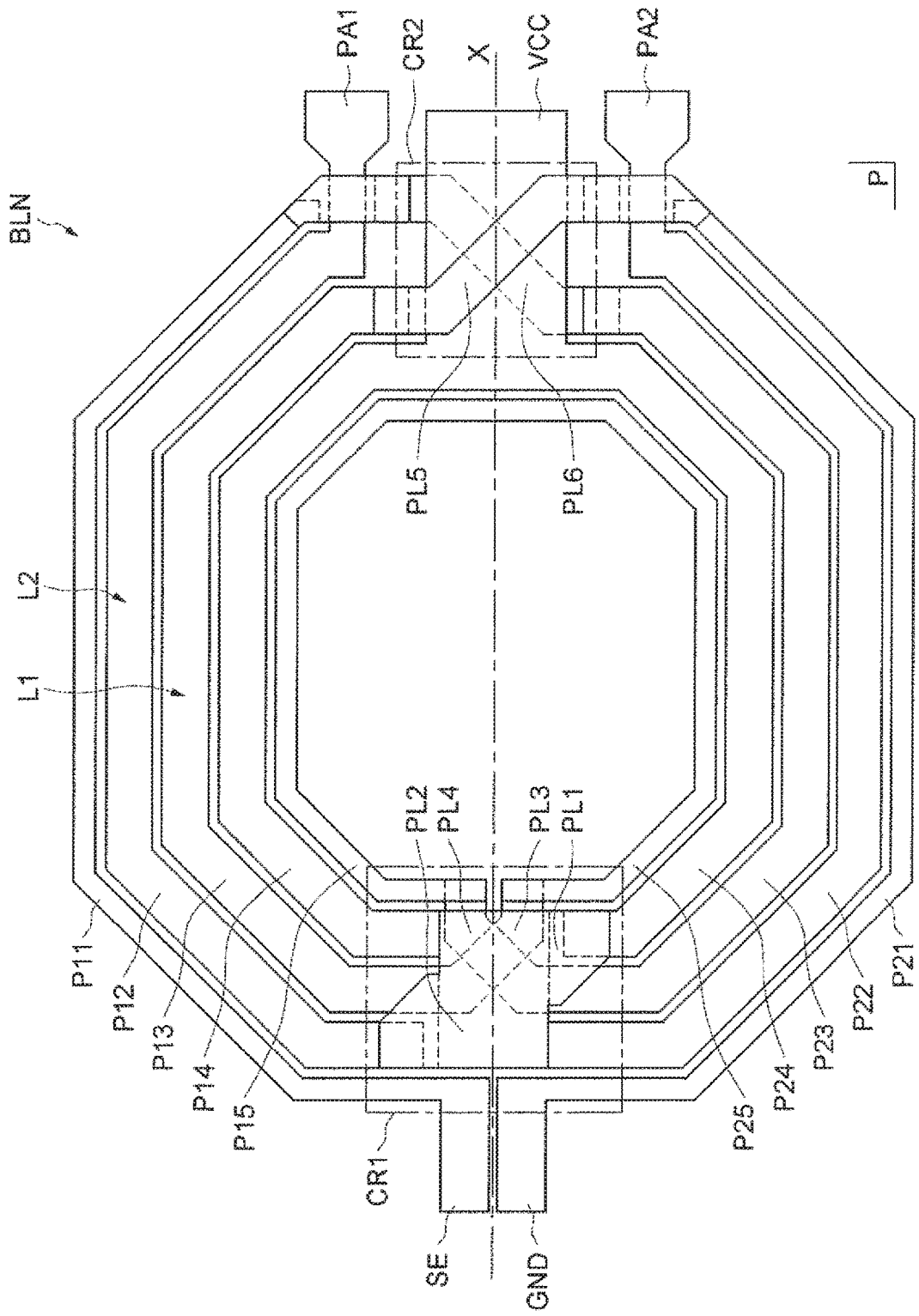
FIG. 1 shows a transformer according to the disclosure in a plan view.

FIG. 1 shows a view from above of one embodiment of a symmetric-asymmetric transformer, or balun BLN. The balun BLN belongs to a plane P comprising an axis X forming an axis of symmetry for the whole architecture of this embodiment, and is fabricated on a semiconductor substrate SC.

The balun BLN comprises a primary inductive circuit L1 formed by metal tracks whose disposition forms an octagonal loop which is wound and unwound while making three complete rotations, or three turns. The primary circuit L1 comprises two terminals SE and GND designed to be connected in asymmetric, or single-ended, mode respectively to a load and to ground. For example, the load may be a transmitting or receiving antenna.

The terminals SE and GND of the primary circuit L1 are disposed side-by-side in a symmetrical manner with respect to the axis X, on an external side of the balun BLN. The balun BLN also comprises a secondary inductive circuit L2, formed by metal tracks whose disposition forms an octagonal loop which is wound and unwound while making two turns, in an interleaved manner with the turns of the loop of the primary circuit L1.

The metal tracks P11-P15, P21-P25 forming the turns of the primary L1 and secondary L2 circuits are situated in the same metallization level. Furthermore, the octagonal geometries of the loops of the primary and secondary circuits are given by way of a non-limiting example, and may take another polygonal or circular form.

The secondary circuit L2 comprises two terminals PA1 and PA2 designed to be connected in a symmetric, or differential, mode to transistors of a power amplifier circuit, for example. A biasing terminal VCC is connected to a mid-point of the secondary circuit L2 and is designed to receive a common-mode DC voltage.

The terminals PA1, VCC and PA2 of the secondary circuit L2 are respectively disposed side-by-side in a symmetrical manner with respect to the axis X. This is on an external side of the balun BLN, opposite to the side comprising the terminals SE, GND of the primary circuit L1.

Thus, the interleaved nature of the primary L1 and secondary L2 inductive circuits provides an arrangement in which the metal tracks of the turns of the primary circuit L1 are disposed on either side of, and directly next to, the track of each turn of the secondary circuit L2. The winding and unwinding of the turns of the primary and secondary circuits introduce crossing points for metal tracks. Thus, the metal tracks are stacked, notably in the crossing regions, passing over and under the metallization level of the turns, in respectively higher and lower levels of metallization.

It is nevertheless considered that the balun BLN is included within a plane P and that the symmetry with respect to the axis X does not take into account the differences in height of the levels of metallization. This is commonly admitted in microelectronics due to the very small vertical dimensions of the architecture.

Thus, the balun BLN comprises two crossing regions CR1 and CR2 in which the metal tracks cross one another, via metal tracks referred to as connection tracks.

The first crossing region CR1 is situated in the turns on the side of the terminals SE, GND of the primary circuit and comprises a crossing of the primary circuit L1 and a crossing of the secondary circuit L2. The second crossing region CR2 is situated in the turns on the side of the terminals of the secondary circuit L2 and comprises a crossing of the primary circuit, passing vertically on either side of the biasing terminal VCC.

The primary circuit L1 runs from the terminal SE to the terminal GND via a track P11 which arrives at the second crossing region CR2. A metal connection track PL6 directs the turn towards the interior of the loop and connects the track P11 to a track P23 which runs to the first crossing region CR1. In the crossing region CR1, a connection track PL4 directs the turn towards the interior and connects the track P23 to a track P15.

The primary circuit L1 has described a first turn (one complete circuit). The circuit then describes a second turn according to two half-turns formed by the tracks P15 and P25 connected together at a mid-point. The loop of the primary circuit has so far been wound and then starts to unwind. The track P25 arrives at the first crossing region CR1, in which a connection track PL3 directs the turn towards the exterior and connects the track P25 to a track P13. The track P13 runs to the second crossing region CR2, in which the connection track PL5 directs the turn towards the exterior and connects the track P13 to a track P21. The track P21 then arrives at the ground terminal GND. The tracks of the primary circuit L1 have thus formed a loop of three turns which is wound and unwound.

The secondary circuit runs from the terminal PA1 to the terminal PA2 passing under the track P11 to join with a track P12 which arrives at the first crossing region CR1. In the crossing region CR1, a connection plate PL1 directs the turn towards the interior and connects the track P12 to a track P24. The track P24 follows a half-turn up to a mid-point position connected to the biasing terminal VCC. Here, the secondary circuit L2 has formed a first turn by winding and starts to unwind. A track P14 starts from the mid-point and arrives at the first crossing region CR1 in which a connection plate PL2 directs the turn towards the exterior and connects the track P14 to a track P22. The track P22 arrives at the terminal PA2 after passing under the track P21.

The tracks of the secondary circuit are disposed between the tracks of the primary circuit. In particular, the track P12 is situated between the track P11 and P13, the track P14 is situated between the tracks P13 and P15, the track P22 is situated between the track P21 and P23, and the track P24 is situated between the tracks P23 and P25. A constant gap separates, from edge to edge, the tracks of the primary circuit and the tracks of the secondary circuit.

Such a configuration forms a structure such that, over all of the positions of the secondary circuit at which a coupling with the primary circuit takes place, the sum of the distances from one terminal of the primary circuit to the corresponding coupled positions of the primary circuit is equal to the sum of the distances from the other terminal of the primary circuit to the same coupled positions.

In this configuration, the secondary circuit is coupled with the primary circuit in equal proportions at positions of the primary circuit close to one terminal and positions of the primary circuit close to the other terminal. In other words, the signal on the secondary circuit sees the ground terminal GND as much as the load terminal SE of the primary circuit.

Thus, when a signal travels over the secondary circuit, this signal is coupled in a uniform manner with the whole of the primary circuit, providing good phase and amplitude symmetries. This allows excellent behaviors with regard to balance of phases and balance of amplitudes to be obtained, and notably for power amplifier applications.

Moreover, the tracks P11, P21, P15 and P25 of the primary circuit L1 are narrower than the other tracks. Their width is approximately half of the width of a track of the secondary circuit L2. Narrower metal tracks notably allow the stray capacitance existing between the metal tracks and the substrate to be reduced. The current flowing in the primary circuit is usually lower than that flowing in the secondary circuit. Thus, an advantageous decrease in the width of the tracks over certain parts of the primary circuit is not detrimental with respect to current flow.

It is also possible to form each of the tracks P13 and P23 in the form of two narrow parallel tracks. Each narrow parallel track may be separated from the edge of the tracks of the secondary circuit by the same constant separation. In this embodiment, the tracks for connecting the primary circuit can have the same thickness as the tracks of the secondary circuit. This is advantageous with regard to noise signals.

Figure 2:
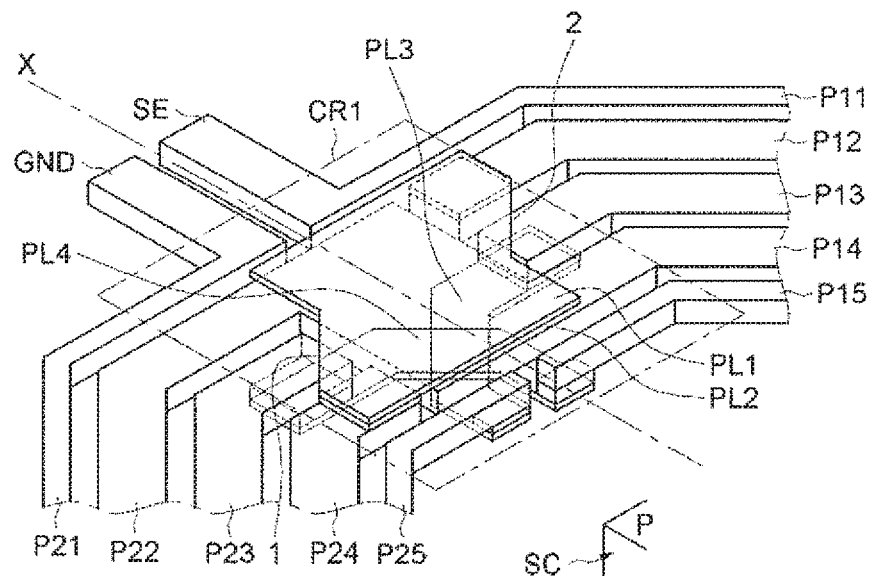
FIGS. 2 and 3 show the crossing regions of the transformer in perspective views.

FIG. 2 shows a perspective view of the first crossing region CR1 in which the interleaved and stacked metal tracks are shown in transparency for a better understanding of the architecture of this embodiment. In the first crossing region CR1, the metal track of the secondary circuit P14 is connected to the metal track P22 via a connection plate PL2. The metal track of the secondary circuit P24 is connected to the track P12 via another connection plate PL1.

The connection plate PL2 is formed at the same level of metal as the metal tracks forming the turns of the primary and secondary inductive circuits, and takes the form of a rectangular plate. The tracks P14 and P22 are connected to the connection plate PL2 on two opposing sides of the rectangular plate, each on one respective end of the side, with the ends being diagonally opposite.

The connection plate PL1 is formed on a level of metal that is higher than the level of the metal tracks of the primary and secondary inductive circuits. The connection plate PL1 also takes the form of a rectangular plate additionally comprising two wings respectively on two opposing sides of the rectangular plate. Each wing is on one end of the respective side, and with the ends being diagonally opposite.

The tracks P12 and P24 are connected to the connection plate PL1 on the lower surface of the respective wings. Furthermore, the connection plates PL1 and PL2 are the same size and are aligned in a vertical axis perpendicular to the plane. The diagonals along which the tracks of the secondary circuit are connected to one connection plate or another opposite to each other.

Moreover, in this non-limiting representation, the wings of the connection plate PL1 each have a bevel 1 and 2 at their attachment with the rectangular plate PL1. This configuration is advantageous with regard to current flow and is not detrimental to the balanced aspect of the couplings implemented by the disclosure. Indeed, although not being strictly geometrically symmetric with respect to the axis X, this configuration is balanced with regard to coupling between the primary and secondary circuits.

Figure 3:
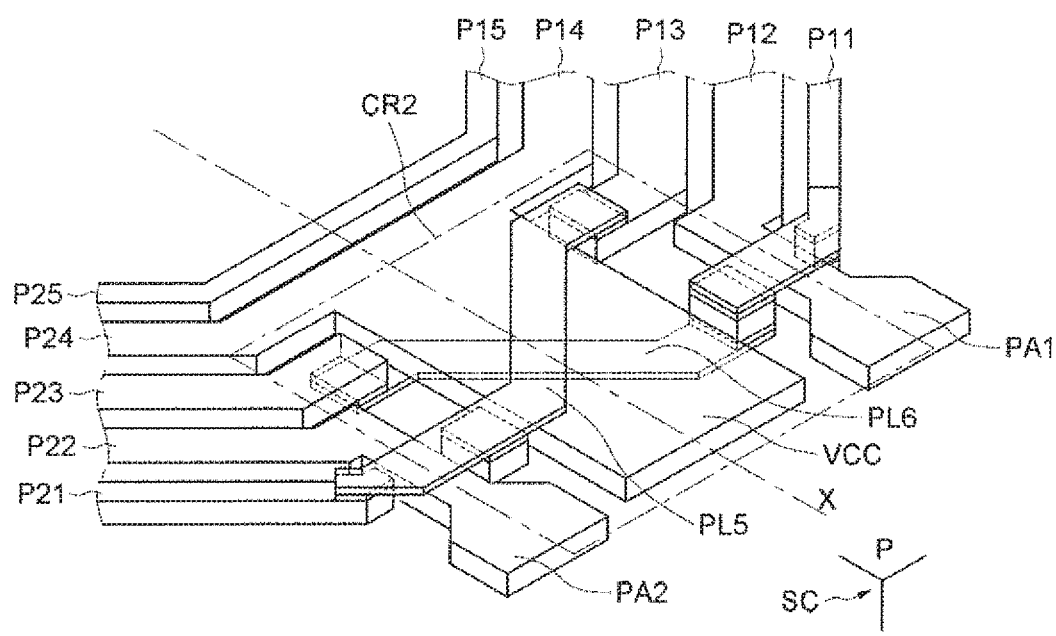

FIG. 3 shows a perspective view of the second crossing region CR2 in which the interleaved and stacked metal tracks are also shown in transparency for a better understanding of the architecture provided for this embodiment. In the second crossing region CR2, the metal track of the primary circuit P11 is connected to the metal track P23 via a connection track PL6. The connection track PL6 is at a lower level than the metallization level of the tracks forming the turns of the circuit, passing under the biasing terminal VCC.

The metal track P13 is connected to the track P21 via a connection track PL5, passing over the biasing terminal VCC, in a higher metallization level than the metallization level of the tracks forming the turns of the circuit.

The biasing terminal VCC takes the form of a rectangular plate and is connected along one of its widths in such a manner as to be centered on the mid-point of the secondary circuit. The width of the rectangular plate of the biasing terminal measures around twice the width of a metal track due to the high current flowing on the biasing terminal.

Thus, the connection tracks PL5 and PL6 cross each other on either side of the biasing terminal VCC in a symmetrical manner with respect to the axis X. This provides good performance characteristics with regard to phase and amplitude symmetries.

The connection tracks PL5 and PL6 may take the form of rectangular plates of identical size to the plate of the biasing terminal VCC, superposed over each other and with the biasing terminal. All three are aligned along a vertical axis perpendicular to the plane P.

Figure 4:
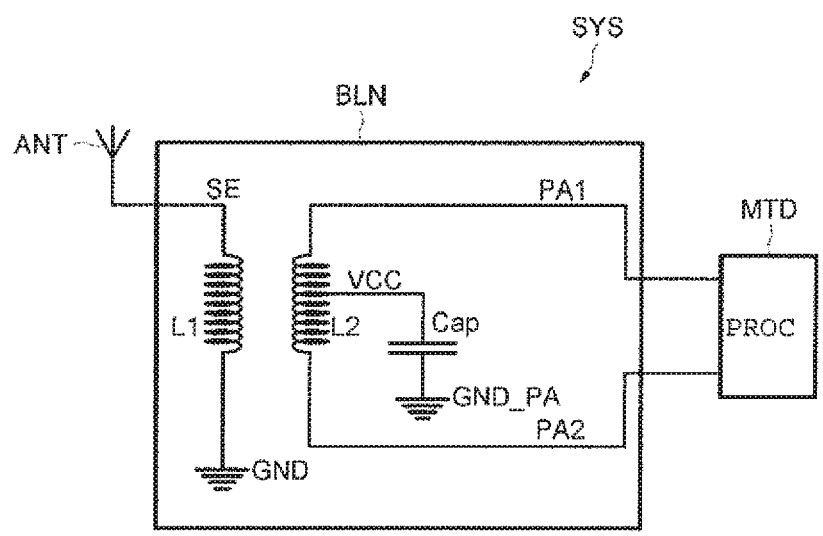
FIG. 4 shows an input or output stage of a radio frequency telecommunications system comprising a transformer according to the disclosure.

The disclosure may advantageously be employed for any power application in radio frequency (RF) telecommunications systems, and FIG. 4 shows one example of an input or output stage of such a system SYS. For example, the system is of the cellular mobile telephone or tablet type, and comprises a balun BLN according to the disclosure.

The terminal SE of the primary circuit L1 of the balun BLN is connected to an antenna ANT, typically with an impedance of 50 Ohms, and the terminal GND is connected to an external ground. The antenna may be used both as a transmitter and a receiver.

The terminals PA1 and PA2 of the secondary circuit L2 are, on the other hand, connected to processing means or a processor MTD in differential mode. This may comprise, for example, a low-noise amplifier LNA. The mid-point of the secondary circuit L2 is connected to a decoupling capacitor Cap connected to the ground GND_PA associated with the differential-mode circuit connected to the terminals of the secondary circuit L2.

The balun BLN thus supplies an output signal in a differential mode (or in single-ended mode) starting from an input signal received in a single-ended mode (or in differential mode) with very little losses, excellent phase and amplitude symmetries, while at the same time allowing the passage of a current of high intensity. Such performance characteristics allow the efficiency of power amplifiers combined with the transformer BLN according to the disclosure to be optimized.

Furthermore, the disclosure is not limited to the embodiments that have just been described but encompasses all their variations. Thus, a balun comprising a primary circuit with three turns and a secondary circuit with two turns has been described, but it is possible, notably in order to design the impedance transformation ratio of the balun BLN, for the primary circuit to comprise N+1 turns and the secondary circuit to comprise N turns. N is an integer number greater than or equal to 2. The number of first crossing regions and of second crossing regions comprising the features previously described may vary as a function of the number of turns on the primary and secondary circuits.

What is claimed is:

1. A balun transformer comprising:
    a primary inductive circuit having a first terminal and a second terminal;
    a secondary inductive circuit having a third terminal, a fourth terminal and a fifth terminal;
    a first crossing region located on a first side of the balun transformer; and
    a second crossing region located on a second side of the balun transformer, the second side being opposite to the first side, wherein:
    the fifth terminal is located in the second crossing region, the primary inductive circuit comprises:
        a first metal track,
        a first connection track located in the second crossing region, the first metal track coupled between the first terminal and the first connection track,
        a second metal track,
        a second connection track located in the first crossing region, the second metal track coupled between the first connection track and the second connection track,
        a third metal track,
        a fourth metal track, the third metal track coupled between the second connection track and the fourth metal track,
        a third connection track located in the first crossing region, the fourth metal track coupled between the third metal track and the third connection track,
        a fifth metal track,
        a fourth connection track located in the second crossing region, the fifth metal track coupled between the third connection track and the fourth connection track, and
        a sixth metal track coupled between the fourth connection track and the second terminal,
    the secondary inductive circuit comprises:
        a seventh metal track,
        a fifth connection track located in the first crossing region, the seventh metal track coupled between the third terminal and the fifth connection track,
        an eighth metal track coupled between the fifth connection track and the fifth terminal,
        a ninth metal track,
        a sixth connection track located in the first crossing region, the ninth metal track coupled between the fifth terminal and the sixth connection track, and
        a tenth metal track coupled between the sixth connection track and the fourth terminal, and
    the first, second, third, fourth, fifth, sixth, seventh, eighth, ninth, and tenth metal tracks are located in a first metallization level, the first metallization level located in a plane.

2. The balun transformer of claim 1, wherein the first and second terminals are adjacent to the first crossing region, wherein the third, fourth, and fifth terminals are adjacent to the second crossing region, and wherein a first axis that crosses the first and second crossing regions is an axis of symmetry of the balun transformer.

3. The balun transformer of claim 1, wherein the third terminal is coupled to the seventh metal track through a metal portion that passes under the first metal track.

4. The balun transformer of claim 3, wherein the fourth terminal is coupled to the tenth metal track through a metal portion that passes under the sixth metal track.

5. The balun transformer of claim 1, wherein one of the first, third, fourth, and sixth metal tracks has a first width, one of the second, fifth, seventh, eighth, ninth, and tenth metal tracks has a second width, the first width being narrower than the second width.

6. The balun transformer of claim 5, wherein each of the first, third, fourth, and sixth metal tracks is narrower than each of the second, fifth, seventh, eighth, ninth, and tenth metal tracks.

7. The balun transformer of claim 5, wherein the first width is about half the second width.

8. The balun transformer of claim 5, wherein the fifth terminal has a third width, and wherein the third width is wider than the second width.

9. The balun transformer of claim 1, wherein the sixth connection track is located in the first metallization level, and wherein the fifth connection track is located in a second metallization level, the second metallization level being different than the first metallization level.

10. The balun transformer of claim 1, wherein the fifth and sixth connection tracks are substantially identical in shape and are aligned along a vertical axis perpendicular to the plane.

11. A balun transformer comprising:
a primary inductive circuit having a first terminal and a second terminal;
a secondary inductive circuit having a third terminal, a fourth terminal, and a fifth terminal;
a first crossing region located on a first side of the balun transformer; and
a second crossing region located on a second side of the balun transformer, the second side being opposite to the first side, wherein the fifth terminal is located in the second crossing region.

12. The balun transformer of claim 11, wherein the primary inductive circuit comprises:
a first terminal and a second terminal;
a first connection track, a second connection track, a third connection track, and a fourth connection track; and
a first metal track, a second metal track, a third metal track, a fourth metal track, a fifth metal track, and a sixth metal track,
wherein the first metal track is coupled between the first terminal and the first connection track, wherein the second metal track is coupled between the first connection track and the second connection track, wherein the third metal track is coupled between the second connection track and the fourth metal track, wherein the fourth metal track is coupled between the third metal track and the third connection track, wherein the fifth metal track is coupled between the third connection track and the fourth connection track, and wherein the sixth metal track is coupled between the fourth connection track and the second terminal.

13. The balun transformer of claim 12, wherein the secondary inductive circuit comprises:
a third terminal, a fourth terminal, and a fifth terminal;
a fifth connection track and a sixth connection track; and
a seventh metal track, an eighth metal track, a ninth metal track, and a tenth metal track,
wherein the seventh metal track is coupled between the third terminal and the fifth connection track, wherein the eighth metal track is coupled between the fifth connection track and the fifth terminal, wherein the ninth metal track is coupled between the fifth terminal and the sixth connection track, and wherein the tenth metal track is coupled between the sixth connection track and the fourth terminal.

14. The balun transformer of claim 13, wherein the first, second, third, fourth, fifth, sixth, seventh, eighth, ninth, and tenth metal tracks are located in a first metallization level, the first metallization level located in a plane.

15. The balun transformer of claim 14, wherein the first and second terminals are adjacent to the first crossing region, wherein the third, fourth, and fifth terminals are adjacent to the second crossing region, and wherein a first axis that crosses the first and second crossing regions is an axis of symmetry of the balun transformer.

16. The balun transformer of claim 14, wherein the third terminal is coupled to the seventh metal track through a metal portion that passes under the first metal track.

17. The balun transformer of claim 16, wherein the fourth terminal is coupled to the tenth metal track through a metal portion that passes under the sixth metal track.

18. The balun transformer of claim 14, wherein one of the first, third, fourth, and sixth metal tracks has a first width, one of the second, fifth, seventh, eighth, ninth, and tenth metal tracks has a second width, the first width being narrower than the second width.

19. A balun transformer, comprising a primary inductive circuit comprising:
a first terminal and a second terminal;
a first connection track, a second connection track, a third connection track, and a fourth connection track; and
a first metal track, a second metal track, a third metal track, a fourth metal track, a fifth metal track, and a sixth metal track,
wherein the first metal track is coupled between the first terminal and the first connection track, wherein the second metal track is coupled between the first connection track and the second connection track, wherein the third metal track is coupled between the second connection track and the fourth metal track, wherein the fourth metal track is coupled between the third metal track and the third connection track, wherein the fifth metal track is coupled between the third connection track and the fourth connection track, and wherein the sixth metal track is coupled between the fourth connection track and the second terminal.

20. The balun transformer of claim 19, further comprising a secondary inductive circuit comprising:
a third terminal, a fourth terminal, and a fifth terminal;
a fifth connection track and a sixth connection track; and
a seventh metal track, an eighth metal track, a ninth metal track, and a tenth metal track,
wherein the seventh metal track is coupled between the third terminal and the fifth connection track, wherein the eighth metal track is coupled between the fifth connection track and the fifth terminal, wherein the ninth metal track is coupled between the fifth terminal and the sixth connection track, and wherein the tenth metal track is coupled between the sixth connection track and the fourth terminal.

21. The balun transformer of claim 20, wherein the first, second, third, fourth, fifth, sixth, seventh, eighth, ninth, and tenth metal tracks are located in a first metallization level located in a plane.

22. The balun transformer of claim 20, wherein the third terminal is coupled to the seventh metal track through a metal portion that passes under the first metal track, wherein the fourth terminal is coupled to the tenth metal track through a metal portion that passes under the sixth metal track.

23. The balun transformer of claim 20, wherein each of the first, third, fourth, and sixth metal tracks is narrower than each of the second, fifth, seventh, eighth, ninth, and tenth metal tracks.

* * * * *